US012765137B2

(12) United States Patent
Aota et al.

(10) Patent No.: US 12,765,137 B2
(45) Date of Patent: Oct. 13, 2026

(54) LIGHT-EMITTING DEVICE AND PROJECTOR

(71) Applicant: SEIKO EPSON CORPORATION, Tokyo (JP)

(72) Inventors: Masaaki Aota, Suwa (JP); Yoji Kitano, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 796 days.

(21) Appl. No.: 17/876,486

(22) Filed: Jul. 28, 2022

(65) Prior Publication Data

US 2023/0031175 A1 Feb. 2, 2023

(30) Foreign Application Priority Data

Jul. 29, 2021 (JP) ................................ 2021-124152

(51) Int. Cl.

| | |
|---|---|
| ***G02F 1/1335*** | (2006.01) |
| ***G03B 21/00*** | (2006.01) |
| ***G03B 21/20*** | (2006.01) |
| ***H10H 20/855*** | (2025.01) |
| ***H10H 20/857*** | (2025.01) |
| *H10H 20/825* | (2025.01) |

(52) U.S. Cl.

CPC ......... *H10H 20/855* (2025.01); *G03B 21/006* (2013.01); *G03B 21/2033* (2013.01); *H10H 20/857* (2025.01); *H10H 20/825* (2025.01)

(58) Field of Classification Search

CPC ....................... H10H 20/855; G02D 1/133548

See application file for complete search history.

(56) References Cited

U.S. PATENT DOCUMENTS

| | | | |
|---|---|---|---|
| 7,763,881 | B2 | 7/2010 | Lee et al. |
| 8,450,824 | B2 | 5/2013 | Nakamura et al. |
| 11,170,327 | B2 | 11/2021 | Suginishi et al. |
| 2005/0199888 | A1 | 9/2005 | Seong et al. |
| 2007/0272933 | A1 | 11/2007 | Kim et al. |

(Continued)

FOREIGN PATENT DOCUMENTS

| | | |
|---|---|---|
| JP | H1032155 | 2/1998 |
| JP | 2009033181 | 2/2009 |

(Continued)

*Primary Examiner* — Eric K Ashbahian

(74) *Attorney, Agent, or Firm* — JCIPRNET

(57) ABSTRACT

A light-emitting device includes a substrate, a laminated structure provided at the substrate, and a conductive layer provided at the laminated structure and configured to apply an electric current to the laminated structure. The laminated structure is provided between the substrate and the conductive layer, and includes a first semiconductor layer of a first conductive type, a second semiconductor layer of a second conductive type different from the first conductive type, and a light-emitting layer provided between the first semiconductor layer and the second semiconductor layer. The conductive layer includes a plurality of wire portions extending in a direction orthogonal to a lamination direction of the laminated structure, and is configured to polarize light generated at the light-emitting layer, and an electric current is applied to the light-emitting layer via the plurality of wire portions.

13 Claims, 7 Drawing Sheets

(56) References Cited

U.S. PATENT DOCUMENTS

| | | | | |
|---|---|---|---|---|
| 2009/0032800 | A1 | 2/2009 | Lee et al. | |
| 2010/0127238 | A1* | 5/2010 | Kim | H10H 20/8316 977/773 |
| 2010/0238966 | A1 | 9/2010 | Mochizuki | |
| 2010/0271566 | A1* | 10/2010 | Liao | G02B 6/0073 257/98 |
| 2013/0075762 | A1 | 3/2013 | Nakamura et al. | |
| 2016/0357064 | A1* | 12/2016 | Nielson | G03B 21/006 |
| 2017/0294565 | A1* | 10/2017 | Kim | H10H 20/814 |
| 2019/0131577 | A1* | 5/2019 | Mishima | H10K 50/11 |
| 2020/0106244 | A1 | 4/2020 | Noda et al. | |
| 2020/0151633 | A1 | 5/2020 | Suginishi et al. | |
| 2020/0168777 | A1* | 5/2020 | Kang | H01L 25/0753 |
| 2020/0209724 | A1* | 7/2020 | Itoh | G03B 21/16 |
| 2022/0208848 | A1* | 6/2022 | Tan | H10H 20/821 |
| 2023/0345790 | A1* | 10/2023 | Lou | H10K 59/1216 |

FOREIGN PATENT DOCUMENTS

| | | |
|---|---|---|
| JP | 2009117641 | 5/2009 |
| JP | 2010170481 | 8/2010 |
| JP | 2010219307 | 9/2010 |
| JP | 2013068898 | 4/2013 |
| JP | 2013072990 | 4/2013 |
| JP | 2016151826 | 8/2016 |
| JP | 2018142660 | 9/2018 |
| JP | 2020057640 | 4/2020 |
| JP | 2020077250 | 5/2020 |
| JP | 2020106733 | 7/2020 |
| JP | 2021064396 | 4/2021 |

* cited by examiner

LIGHT-EMITTING DEVICE AND PROJECTOR

The present application is based on, and claims priority from JP Application Serial Number 2021-124152, filed Jul. 29, 2021, the disclosure of which is hereby incorporated by reference herein in its entirety.

BACKGROUND

1. Technical Field

The present disclosure relates to a light-emitting device and a projector.

2. Related Art

A liquid crystal projector requires polarization for displaying an image, and hence it is desired that a light source for the liquid crystal projector emit light having a high degree of polarization.

For example, JP-A-2013-72990 describes a polarized light source including a light-emitting element that is flip-chip coupled to a lead portion and a polarizing plate that is mounted at a position of a window of the lead portion on a side facing the light-emitting element.

However, in the polarized light source descried in JP-A-2013-72990, the light-emitting element and the polarizing plate are provided away from each other, which leads to increase in size.

SUMMARY

According to one aspect of the present disclosure, a light-emitting device includes a substrate, a laminated structure provided at the substrate, and a conductive layer provided at the laminated structure and configured to apply an electric current to the laminated structure, wherein the laminated structure is provided between the substrate and the conductive layer, and includes a first semiconductor layer of a first conductive type, a second semiconductor layer of a second conductive type different from the first conductive type, and a light-emitting layer provided between the first semiconductor layer and the second semiconductor layer, the conductive layer includes a plurality of wire portions extending in a direction orthogonal to a lamination direction of the laminated structure, and is configured to polarize light generated at the light-emitting layer, and an electric current is applied to the light-emitting layer via the plurality of wire portions.

According to one aspect of the present disclosure, a projector includes the light-emitting device according to the one aspect.

DESCRIPTION OF EXEMPLARY EMBODIMENTS

With reference to the drawings, preferred exemplary embodiments of the present disclosure are described in detail hereinafter. Note that the exemplary embodiments described hereinafter are not intended to unjustly limit the content of the present disclosure as set forth in the claims. In addition, all of the configurations described hereinafter are not necessarily essential constituent requirements of the present disclosure.

1. First Exemplary Embodiment

1.1. Light-Emitting Device

Figure 1:
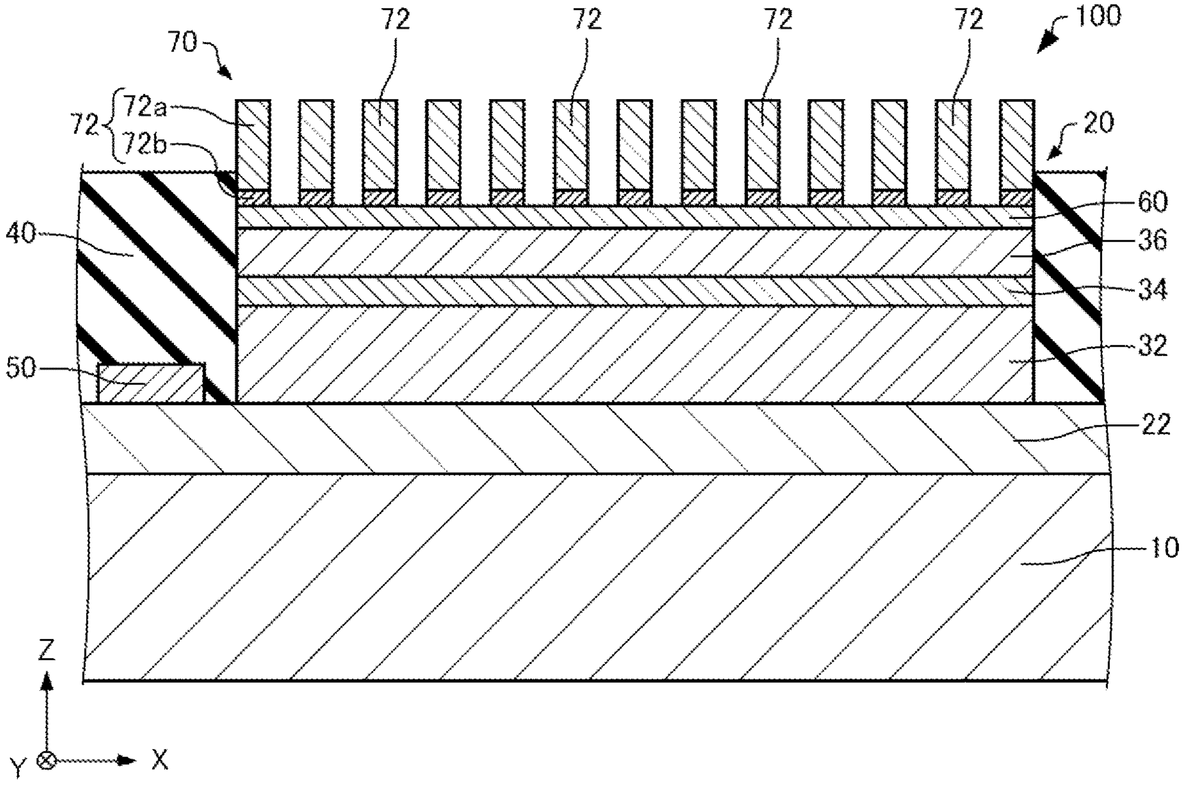
FIG. 1 is a cross-sectional view schematically illustrating a light-emitting device according to a first exemplary embodiment.
Figure 2:
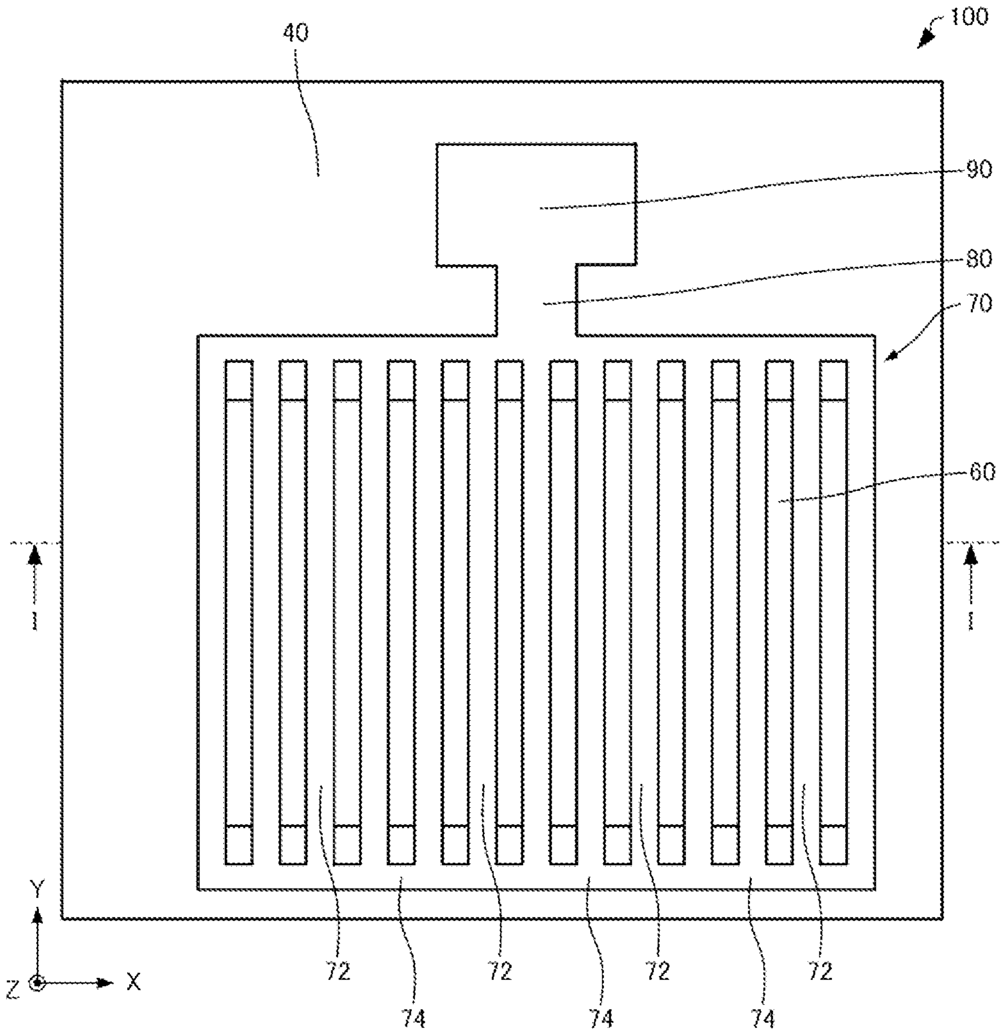
FIG. 2 is a plan view schematically illustrating the light-emitting device according to the first exemplary embodiment.

First, with reference to the drawings, a light-emitting device according to a first exemplary embodiment is described. FIG. 1 is a cross-sectional view schematically illustrating a light-emitting device 100 according to the first exemplary embodiment. FIG. 2 is a plan view schematically illustrating the light-emitting device 100 according to the first exemplary embodiment. Note that FIG. 1 is a cross-sectional view taken along the line I-I in FIG. 2. Further, in FIG. 1 and FIG. 2, an X axis, a Y axis, and a Z axis are illustrated as three axes orthogonal to one another.

As illustrated in FIG. 1 and FIG. 2, for example, the light-emitting device 100 includes a substrate 10, a laminated structure 20, an insulating layer 40, an n-type electrode 50, a first p-type electrode 60, a wire grid polarizing plate 70, a wiring line 80, and a pad 90. The light-emitting device 100 is a Light Emitting Diode (LED).

For example, the substrate 10 is a Si substrate, a GaN substrate, a sapphire substrate, or a SiC substrate.

The laminated structure 20 is provided at the substrate 10. In the example illustrated in FIG. 1, the laminated structure 20 is provided at an upper side of the substrate 10. The laminated structure 20 is provided between the substrate 10 and the wire grid polarizing plate 70. For example, the laminated structure 20 includes a buffer layer 22, a first semiconductor layer 32, a light-emitting layer 34, and a second semiconductor layer 36.

In the present specification, when the light-emitting layer 34 is regarded as a reference in a lamination direction of the laminated structure 20 (hereinafter, also simply referred to as a "lamination direction"), description is given assuming that a direction from the light-emitting layer 34 to the second semiconductor layer 36 is an upward direction and a direction from the light-emitting layer 34 to the first semiconductor layer 32 is a downward direction. Further, a direction orthogonal to the lamination direction is also referred to as an "in-plane direction". Further, "the lamination direction of the laminated structure 20" is a lamination direction of the first semiconductor layer 32 and the light-emitting layer 34. In the illustrated example, the lamination direction is the Z-axis direction.

The buffer layer 22 is provided at the upper side of the substrate 10. The buffer layer 22 is provided between the substrate 10 and the first semiconductor layer 32. The buffer layer 22 is a first conductive-type semiconductor layer. For example, the buffer layer 22 is an n-type Si-doped GaN layer.

The first semiconductor layer 32 is provided at the upper side of the buffer layer 22. The first semiconductor layer 32 is provided between the substrate 10 and the light-emitting layer 34. The first semiconductor layer 32 is a first conductive-type semiconductor layer. For example, the first semiconductor layer 32 is an n-type Si-doped GaN layer.

The light-emitting layer 34 is provided at the upper side of the first semiconductor layer 32. The light-emitting layer 34 is provided between the first semiconductor layer 32 and the second semiconductor layer 36. When an electric current is applied, the light-emitting layer 34 generates light. For example, the light-emitting layer 34 includes a well layer and a barrier layer. Each of the well layer and the barrier layer is an i-type semiconductor layer without doping in impurities on purpose. For example, the well layer is an InGaN layer. For example, the barrier layer is a GaN layer. The light-emitting layer 34 has a Multiple Quantum Well (MQW) structure formed of well layers and barrier layers.

Note that, the number of well layers and barrier layers forming the light-emitting layer 34 is not particularly limited. For example, only one well layer may be provided. In this case, the light-emitting layer 34 has a Single Quantum Well (SQW) structure.

The second semiconductor layer 36 is provided at the upper side of the light-emitting layer 34. The second semiconductor layer 36 is a second conductive-type semiconductor layer that is different from the first conductive type. For example, the second semiconductor layer 36 is a p-type Mg-doped GaN layer. Each of the first semiconductor layer 32 and the second semiconductor layer 36 is a clad layer having a function of confining light in the light-emitting layer 34.

Note that, although not illustrated, an Optical Confinement Layer (OCL) formed of an i-type InGaN layer and an i-type GaN layer may be provided in at least one of a space between the first semiconductor layer 32 and the light-emitting layer 34 and a space between the light-emitting layer 34 and the second semiconductor layer 36. Further, the second semiconductor layer 36 may include an Electron Blocking Layer (EBL) formed of a p-type AlGan layer.

In the light-emitting device 100, the p-type second semiconductor layer 36, the i-type light-emitting layer 34, and the n-type first semiconductor layer 32 form a pin diode. In the light-emitting device 100, when a forward bias voltage of the pin diode is applied between the n-type electrode 50 and the first p-type electrode 60, an electric current is applied to the light-emitting layer 34, and an electron and a positive hole are recombined with each other in the light-emitting layer 34. This recombination generates light emission. The light generated at the light-emitting layer 34 passes through the first p-type electrode 60 and the wire grid polarizing plate 70, and is emitted.

Note that, although not illustrated, a reflection layer may be provided between the substrate 10 and the buffer layer 22 or on the lower side of the substrate 10. For example, the reflection layer is a Distributed Bragg Reflector (DBR) layer. The reflection layer can reflect the light generated at the light-emitting layer 34, and the light-emitting device 100 can emit light from the first p-type electrode 60 side.

The insulating layer 40 is provided at the upper side of the buffer layer 22. As viewed from the lamination direction, the insulating layer 40 surrounds the semiconductor layers 32 and 36 and the light-emitting layer 34. In the illustrated example, the upper surface of the insulating layer 40 is positioned in the +Z-axis direction with respect to the upper surface of the first p-type electrode 60, but the position of the upper surface of the insulating layer 40 is not particularly limited. For example, the insulating layer 40 is a silicon oxide layer or a polyimide layer.

The n-type electrode 50 is provided at the upper side of the buffer layer 22. The n-type electrode 50 may be in ohmic contact with the buffer layer 22. The n-type electrode 50 is electrically coupled to the first semiconductor layer 32. In the illustrated example, the n-type electrode 50 is electrically coupled to the first semiconductor layer 32 via the buffer layer 22. The n-type electrode 50 is one electrode for applying an electric current to the light-emitting layer 34. As the n-type electrode 50, for example, an electrode in which a Cr layer, a Ni layer, and an Au layer are laminated in the stated order from the buffer layer 22 is used. Note that, although not illustrated, a contact hole is provided in the insulating layer 40 so as establish conduction with the n-type electrode 50.

The first p-type electrode 60 is provided at the upper side of the second semiconductor layer 36. The first p-type electrode 60 is provided between the laminated structure 20 and the wire grid polarizing plate 70. The first p-type electrode 60 may be in ohmic contact with the second semiconductor layer 36.

The thickness of the first p-type electrode 60 is several tens nanometers or less, for example. When the thickness of the first p-type electrode 60 is several tens nanometers or less, loss of the light can be reduced while the light generated at the light-emitting layer 34 passes through the first p-type electrode 60. The first p-type electrode 60 is another electrode for applying an electric current to the light-emitting layer 34. As the first p-type electrode 60, for example, an electrode in which a Pd layer, a Pt layer, and an Au layer are laminated in the stated order from the second semiconductor layer 36 is used.

The wire grid polarizing plate 70 is provided at the laminated structure 20. In the illustrated example, the wire grid polarizing plate 70 is provided at the laminated structure 20 via the first p-type electrode 60. The wire grid polarizing plate 70 is provided at the upper side of the first p-type electrode 60. The wire grid polarizing plate 70 is in contact with the first p-type electrode 60. The wire grid polarizing plate 70 includes a plurality of wire portions 72. The plurality of wire portions 72 extend in a direction orthogonal to the lamination direction. In the example illustrated in FIG. 2, the plurality of wire portions 72 extend in the Y-axis direction. For example, the pitch of the plurality of wire portions 72 is equal to or less than a half of a wavelength of the light generated at the light-emitting layer 34. Specifically, the pitch of the plurality of wire portions 72 is 400 nm or less, preferably, approximately 100 nm. For example, the width of the wire portion 72 is 300 nm or less, preferably, approximately 60 nm. In the illustrated example, the width of the wire portion 72 is a size of the wire portion 72 in the X-axis direction. The thickness of the wire portion 72 is larger than the thickness of the first p-type electrode 60. In the illustrated example, the thickness of the wire portion 72 is a size of the wire portion 72 in the Z-axis direction. For example, the thickness of the wire portion 72 is larger than twice of the thickness of the first p-type electrode 60.

The wire grid polarizing plate 70 polarizes the light generated at the light-emitting layer 34 with the plurality of wire portions 72. With the plurality of wire portions 72, the wire grid polarizing plate 70 transmits part of the light generated at the light-emitting layer 34, which has an electric field oscillating in the direction orthogonal to the extension direction of the wire portion 72 (in the illustrated example, the X-axis direction), and reflects other part thereof (for example, light having an electric field oscillating in the Y-axis direction) to the laminated structure 20. With this, the wire grid polarizing plate 70 can polarize the light generated at the light-emitting layer 34. In the light-emitting device 100, for example, the wire grid polarizing plate 70 can emit linearly polarized light having an electric field oscillating in the X-axis direction. With the width, the thickness, and the pitch of the wire portion 72, a degree of polarization of the light emitted from the light-emitting device 100 can be controlled.

Note that, for example, the wire grid polarizing plate 70 may be a reflection-type wire grid polarizing plate for reflecting light, which has an electric field oscillating in the Y-axis direction, to the laminated structure 20, or may be an absorption-type wire grid polarizing plate for absorbing light, which has an electric field oscillating in the Y-axis direction.

The wire portion 72 of the wire grid polarizing plate 70 has conductivity. The wire portion 72 is formed to contain metal. For example, as illustrated in FIG. 1, the wire portion 72 includes a first layer 72*a* and a second layer 72*b*. The wire grid polarizing plate 70 corresponds to a "conductive layer" described in the claims. The wire grid polarizing plate 70 applies an electric current to the laminated structure 20.

For example, the material of the first layer 72*a* of the wire portion 72 Al, Ag, or an alloy thereof. The first layer 72*a* formed of such a material may form the wire grid polarizing plate 70 of a reflection type. The first layer 72*a* may be formed of a material containing Al and at least one of amorphous Si, amorphous Ge, and SiN. The first layer 72*a* formed of such a material may form the wire grid polarizing plate 70 of an absorption type.

The second layer 72*b* of the wire portion 72 is provided between the first layer 72*a* and the first p-type electrode 60. A melting point of the second layer 72*b* is higher than a melting point of the first layer 72*a*. For example, the material of the second layer 72*b* is Mo, Ti, $TiN_X$, Ta, or an alloy of those and Al. The thickness of the second layer 72*b* is smaller than the thickness of the first layer 72*a*. For example, the thickness of the second layer 72*b* is smaller than twice of the thickness of the first layer 72*a*.

As illustrated in FIG. 2, the wire grid polarizing plate 70 includes a coupling portion 74 that couples adjacent wire portions 72 of the plurality of wire portions 72 to each other. In the illustrated example, the coupling portion 74 couples ends of the adjacent wire portions 72 in the +Y-axis direction to each other. Moreover, the coupling portion 74 couples ends of the adjacent wire portions 72 in the −Y-axis direction to each other. The coupling portion 74 extends in the X-axis direction from one wire portion 72 of the adjacent wire portions 72 to the other wire portion 72. The wire grid polarizing plate 70 has a shape obtained by forming a slit extending in the Y-axis direction in a plate-like member. In the illustrated example, as viewed from the lamination direction, the coupling portion 74 does not overlap with the first p-type electrode 60, and overlaps with the insulating layer 40. For example, the material of the coupling portion 74 is the same as the wire portion 72.

The wiring line 80 couples the wire grid polarizing plate 70 and the pad 90 to each other. In the illustrated example, the pad 90 is provided in the +Y-axis direction with respect to the wire grid polarizing plate 70. The wiring line 80 extends from the pad 90 in the −Y-axis direction, and is coupled to the wire grid polarizing plate 70. A size of the pad 90 in the X-axis direction is larger than a size of the wiring line 80 in the X-axis direction. For example, a wire bonding, which is not illustrated, is coupled to the pad 90. An electric current flowing through the wire bonding is applied to the light-emitting layer 34 via the pad 90, the wiring line 80, the wire grid polarizing plate 70, and the first p-type electrode 60. In this manner, an electric current is applied to the light-emitting layer 34 via the plurality of wire portions 72 and the first p-type electrode 60. The plurality of wire portions 72 function as an electrode for applying an electric current to the light-emitting layer 34. For example, the materials of the wiring line 80 and the pad 90 are the same as the wire portion 72.

Note that, in the description given above, the InGaN-based light-emitting layer 34 is described. However, as the light-emitting layer 34, various types of materials, which are capable of emitting light at the time of application of an electric current, may be used according to a wavelength of the emitted light. For example, AlGaN-based, AlGaAs-based, InGaAs-based, InGaAsP-based, InP-based, GaP-based, and AlGaP-based semiconductor materials may be used.

For example, the light-emitting device 100 exerts the following actions and effects.

The light-emitting device 100 includes the wire grid polarizing plate 70 provided to the laminated structure 20. Thus, as compared to a case in which the wire grid polarizing plate is not provided to the laminated structure, the light-emitting device 100 can be reduced more in size.

Moreover, in the light-emitting device 100, the wire grid polarizing plate 70 includes the plurality of wire portions 72 extending in the direction orthogonal to the lamination direction, and thus the light generated at the light-emitting layer 34 is polarized. Thus, for example, the light-emitting device 100 can emit linearly polarized light.

Moreover, in the light-emitting device 100, an electric current is applied to the light-emitting layer 34 via the plurality of wire portions 72. Thus, for example, as compared to a case in which an electric current is not applied to the wire portion, an electric current also flows through the wire portion 72, and hence reduction in resistance can be achieved in the light-emitting device 100. Therefore, an electric current can be applied to the light-emitting layer 34 with high uniformity. For example, the first p-type electrode 60 has lower resistivity but a smaller thickness than a second p-type electrode 62. Thus, when the wire portion 72 is not provided, an electric current cannot be applied to the light-emitting layer with high uniformity in some cases. Further, the light having an electric field oscillating in the direction orthogonal to the extension direction of the wire portion 72 is hardly absorbed by the plurality of wire portions 72. Thus, when the wire portion 72 is increased in thickness, resistivity can be further reduced.

In the light-emitting device 100, the first p-type electrode 60 is provided between the laminated structure 20 and the wire grid polarizing plate 70, the wire grid polarizing plate 70 is in contact with the first p-type electrode 60, the light generated at the light-emitting layer 34 passes through the first p-type electrode 60, and is emitted, and an electric current is applied to the light-emitting layer 34 via the first p-type electrode 60. Thus, as compared to a case in which the light-emitting device 100 does not include the first p-type electrode, an electric current can be applied to the light-emitting layer 34 with higher uniformity. Moreover, as compared to a case in which the wire grid polarizing plate and the first p-type electrode are away from each other. size reduction can be achieved more.

In the light-emitting device 100, the wire grid polarizing plate 70 includes the coupling portion 74 that couples adjacent wire portions 72 of the plurality of wire portions 72. Thus, as compared to a case in which the coupling portion 74 is not provided, an electric current can be applied to the plurality of wire portions 72 with higher uniformity in the light-emitting device 100.

In the light-emitting device 100, each of the plurality of wire portions 72 includes the first layer 72*a* and the second layer 72*b* that is provided between the first layer 72*a* and the laminated structure 20 and has a higher melting point than the first layer 72*a*. Thus, in the light-emitting device 100, for example, when heat is generated while the light generated at the light-emitting layer 34 passes through the wire grid polarizing plate 70, the second layer 72*b* can prevent atoms contained in the first layer 72*a* from being dispersed in the first p-type electrode 60 due to the heat. Particularly, Al atoms are easily dispersed. Thus, when the first layer 72*a* contains Al atoms, the second layer 72*b* is preferably provided.

1.2. Method of Manufacturing Light-Emitting Device

Figure 3:
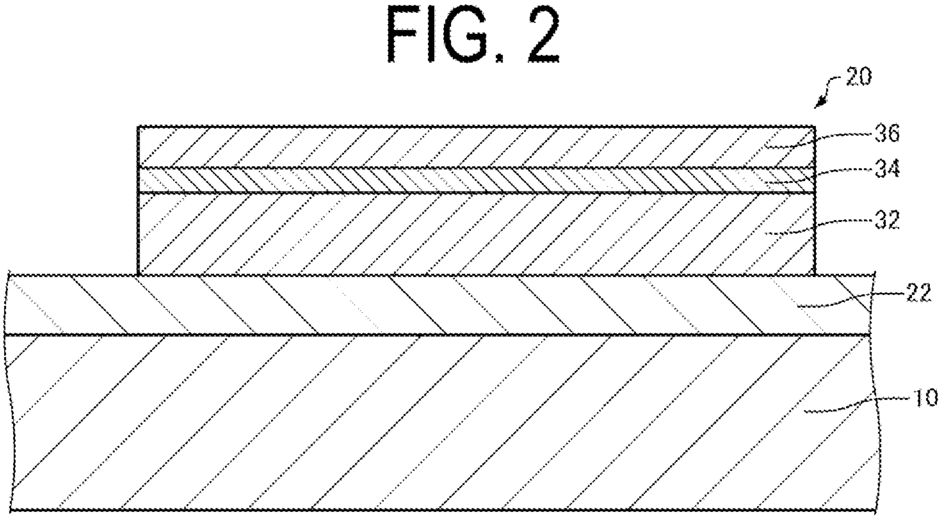
FIG. 3 is a cross-sectional view schematically illustrating a manufacturing process of the light-emitting device according to the first exemplary embodiment.

Next, with reference to the drawings, a method of manufacturing the light-emitting device 100 according to the first exemplary embodiment is described. FIG. 3 is a cross-sectional view schematically illustrating a manufacturing process of the light-emitting device 100 according to the first exemplary embodiment.

As illustrated in FIG. 3, the buffer layer 22 is subjected to epitaxial growth on the upper side of the substrate 10. Examples of methods for epitaxial growth include a Metal Organic Chemical Vapor Deposition (MOCVD) method and a Molecular Beam Epitaxy (MBE) method.

Next, a mask layer, which is not illustrated, is formed on the upper side of the buffer layer 22. For example, the mask layer is formed through film formation by electron beam vapor deposition or spattering, and patterning. For example, patterning is performed by photolithography and etching. For example, the mask layer is a silicon oxide layer, a titanium layer, a titanium oxide layer, or an aluminum oxide layer.

Next, with the mask layer as a mask, the first semiconductor layer 32, the light-emitting layer 34, and the second semiconductor layer 36 are subjected to epitaxial growth in the stated order on the upper side of the buffer layer 22. Examples of methods for epitaxial growth include an MOCVD method and an MBE method. Through this process, the laminated structure 20 can be formed.

As illustrated in FIG. 1, the n-type electrode 50 is formed on the upper side of the buffer layer 22. For example, the n-type electrode 50 is formed by spattering or vacuum vapor deposition.

Next, the insulating layer 40 is formed on the upper side of the buffer layer 22 and the n-type electrode 50. For example, the insulating layer 40 is formed by a Chemical Vapor Deposition (CVD) method or spin coating.

Next, the first p-type electrode 60 is formed on the upper side of the second semiconductor layer 36. For example, the first p-type electrode 60 is formed by spattering or vacuum vapor deposition.

Next, the conductive layer is formed on the upper side of the first p-type electrode 60. For example, the conductive layer is formed by spattering or vacuum vapor deposition. Next, a resist layer is formed on the conductive layer, and the resist layer is exposed to light and developed. Subsequently, with the resist layer as a mask, the conductive layer is subjected to etching. After that, the resist layer is removed. For example, exposure to light is performed through two-light flux interference exposure. For example, dry etching is performed by using $Cl_2$ gas, $BCl_3$ gas, $Cl_4$ gas, or mixture gas of those. Through this process, the wire grid polarizing plate 70 including the wire portion 72 and the coupling portion 74 can be formed. Moreover, through this process, the wiring line 80 and the pad 90 are formed.

Through the process described above, the light-emitting device 100 can be manufactured.

2. Second Exemplary Embodiment

2.1. Light-Emitting Device

Figure 4:
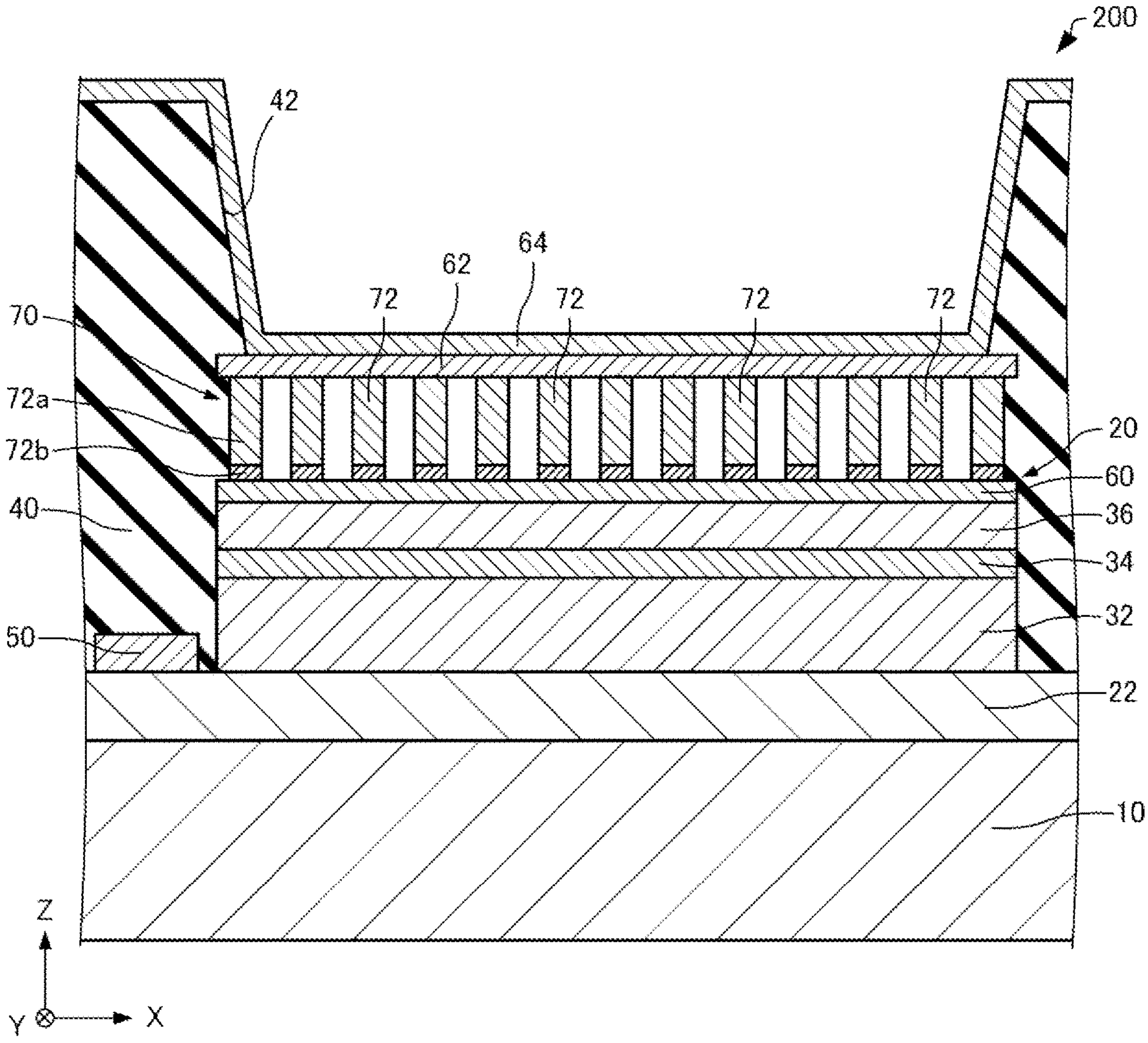
FIG. 4 is a cross-sectional view schematically illustrating a light-emitting device according to a second exemplary embodiment.
Figure 5:
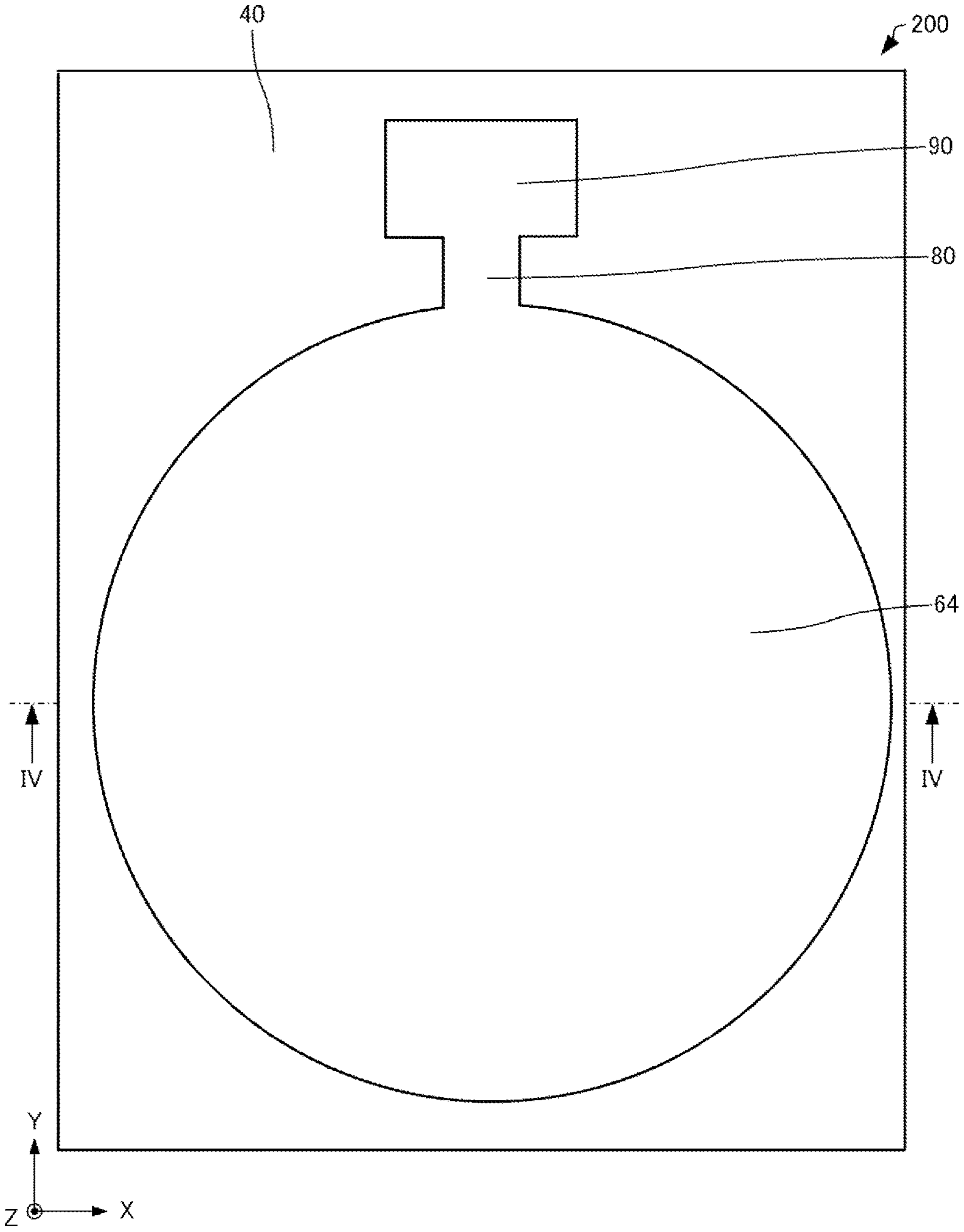
FIG. 5 is a plan view illustrating the light-emitting device according to the second exemplary embodiment.

Next, with reference to the drawings, a light-emitting device 200 according to a second exemplary embodiment is described. FIG. 4 is a cross-sectional view schematically illustrating the light-emitting device 200 according to the second exemplary embodiment. FIG. 5 is a plan view illustrating the light-emitting device 200 according to the second exemplary embodiment. Note that FIG. 4 is a cross-sectional view taken along the line IV-IV in FIG. 5.

For the light-emitting device 200 according to the second exemplary embodiment, parts having similar functions to the constituent members in the light-emitting device 100 according to the first exemplary embodiment described above are denoted below with the same reference symbols, and detailed description therefor is omitted.

As illustrated in FIG. 4 and FIG. 5, the light-emitting device 200 is different from the light-emitting device 100 described above in that the second p-type electrode 62 and a third p-type electrode 64 are included.

As illustrated in FIG. 4, the second p-type electrode 62 is provided at the wire grid polarizing plate 70 on the opposite side to the first p-type electrode 60. The second p-type electrode 62 is provided at the upper side of the plurality of wire portions 72. The second p-type electrode 62 is coupled to the plurality of wire portions 72. The second p-type electrode 62 is provided over the plurality of wire portions 72. The second p-type electrode 62 is provided between the wire grid polarizing plate 70 and the third p-type electrode 64. For example, the thickness of the second p-type electrode 62 is smaller than the thickness of the wire portion 72, and is larger than the thickness of the first p-type electrode 60.

Resistivity of the wire portion 72 and resistivity of the first p-type electrode 60 are lower than resistivity of the second p-type electrode 62. The second p-type electrode 62 is a transparent electrode that is transparent with respect to the light generated at the light-emitting layer 34. For example, the second p-type electrode 62 is an Indium Tin Oxide (ITO) layer or a ZnO layer.

The third p-type electrode 64 is provided at the upper side of the second p-type electrode 62. Moreover, the third p-type electrode 64 is provided at the upper side of the insulating layer 40 and at a side surface of the insulating layer 40, which defines an opening portion 42 provided in the insulating layer 40. For example, the thickness of the third p-type electrode 64 is smaller than the thickness of the wire portion 72, and is larger than the thickness of the first p-type electrode 60. For example, the material of the third p-type electrode 64 is the same as the second p-type electrode 62. In the example illustrated in FIG. 5, the shape of the third p-type electrode 64 is a circular shape.

Note that, although not illustrated, the wire portion 72 may include a third layer between the first layer 72*a* and the second p-type electrode 62. The third layer has a higher melting point than the first layer 72*a*. With this, Al contained in the first layer 72*a* causes a battery reaction with the second p-type electrode 62 being an ITO layer, which prevents Al contained in the first layer 72*a* from being melted. For example, the material of the third layer is the same as the second layer 72*b*.

Here, as illustrated in FIG. 2, in the light-emitting device 100 described above, the wiring line 80 couples the wire grid polarizing plate 70 and the pad 90 to each other.

In contrast, as illustrated in FIG. 5, in the light-emitting device 200, the wiring line 80 couples the third p-type electrode 64 and the pad 90 to each other. For example, the material of the wiring line 80 and the material of the pad 90 are the same as the third p-type electrode 64. An electric current flowing through the wire bonding, which is not illustrated, coupled to the pad 90 is applied to the light-emitting layer 34 via the pad 90, the wiring line 80, the third p-type electrode 64, the second p-type electrode 62, the wire grid polarizing plate 70, and the first p-type electrode 60.

For example, the light-emitting device 200 exerts the following actions and effects.

In the light-emitting device 200, there is included the second p-type electrode 62 that is provided at the wire grid polarizing plate 70 on the opposite side of the first p-type electrode 60 and is coupled to the plurality of wire portions 72. Thus, in the light-emitting device 200, the second p-type electrode 62 can protect the wire portion 72. The width of the wire portion 72 is small. Thus, for example, when the wire portion 72 is exposed, and is brought into contact with moisture or an external member while forming the insulating layer 40 or during use as a product, the wire portion 72 may fall down. In the light-emitting device 200, the second p-type electrode 62 can protect the wire portion 72, and hence a risk that the wire portion 72 may fall down can be lowered.

In the light-emitting device 200, the second p-type electrode 62 is a transparent electrode that is transparent with respect to the light generated at the light-emitting layer 34, and resistivity of each of the plurality of wire portions 72 is lower than resistivity of the second p-type electrode 62. Thus, in the light-emitting device 200, an electric current flowing through the second p-type electrode 62 can preferentially flow through the wire portion 72 with low resistivity at a portion overlapping with the wire portion 72. Thus, as compared to a case in which the wire portion 72 is not provided, an electric current can be applied to the light-emitting layer 34 with higher uniformity.

2.2. Method of Manufacturing Light-Emitting Device

Figure 6:
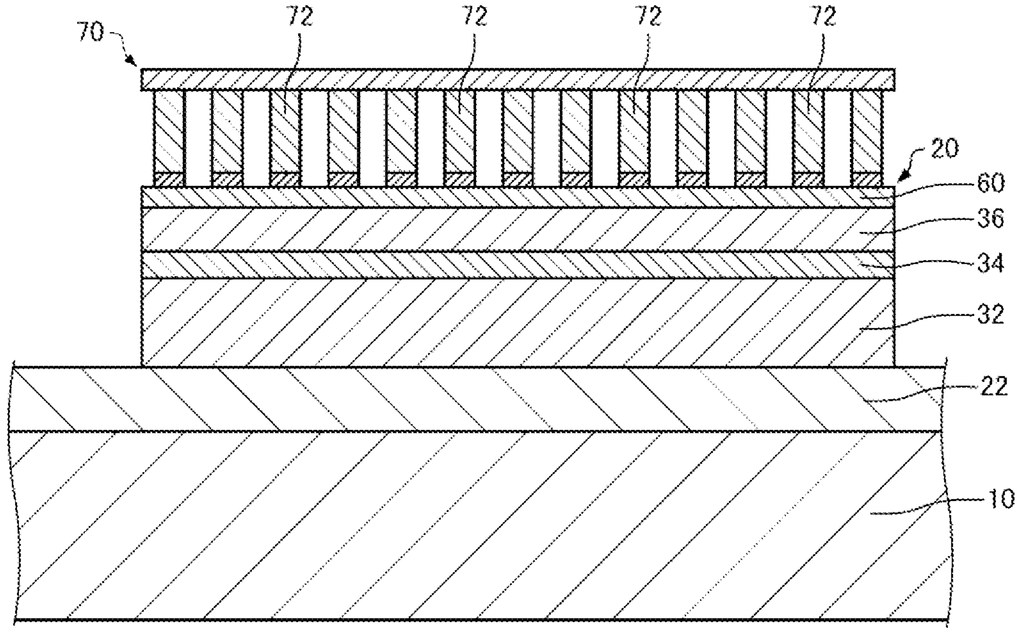
FIG. 6 is a cross-sectional view schematically illustrating a manufacturing process of the light-emitting device according to the second exemplary embodiment.

Next, with reference to the drawings, a method of manufacturing the light-emitting device 200 according to the second exemplary embodiment is described. FIG. 6 is a cross-sectional view schematically illustrating a manufacturing process of the light-emitting device 200 according to the second exemplary embodiment.

Similarly to the method of manufacturing the light-emitting device 100 described above, the laminated structure 20, the first p-type electrode 60, and the wire grid polarizing plate 70 are formed in the method of manufacturing the light-emitting device 200. Sequentially, as illustrated in FIG. 6, the second p-type electrode 62 is formed on the upper side of the plurality of wire portions 72. For example, the second p-type electrode 62 is formed by spattering or vacuum vapor deposition. The second p-type electrode 62, the plurality of wire portions 72, and the first p-type electrode 60 may collectively be subjected to etching, thereby forming the second p-type electrode 62, the plurality of wire portions 72, and the first p-type electrode 60 that have predetermined shapes.

As illustrated in FIG. 4, the n-type electrode 50 is formed on the upper side of the buffer layer 22. For example, the n-type electrode 50 is formed by spattering or vacuum vapor deposition.

Next, the insulating layer 40 is formed on the upper side of the buffer layer 22 and the n-type electrode 50. For example, the insulating layer 40 is formed by spin coating or the CVD method. Next, the insulating layer 40 is subjected to etching, thereby forming the opening portion 42.

Next, the third p-type electrode 64 is formed on the upper side of the second p-type electrode 62, on the upper side of the insulating layer 40, and at the side surface of the insulating layer 40, which defines the opening portion 42. For example, the third p-type electrode 64 is formed by spattering or vacuum vapor deposition. Moreover, through this process, the wiring line 80 and the pad 90 are formed.

Through the process described above, the light-emitting device 200 can be manufactured.

3. Third Exemplary Embodiment 3.1. Light-Emitting Device

Figure 7:
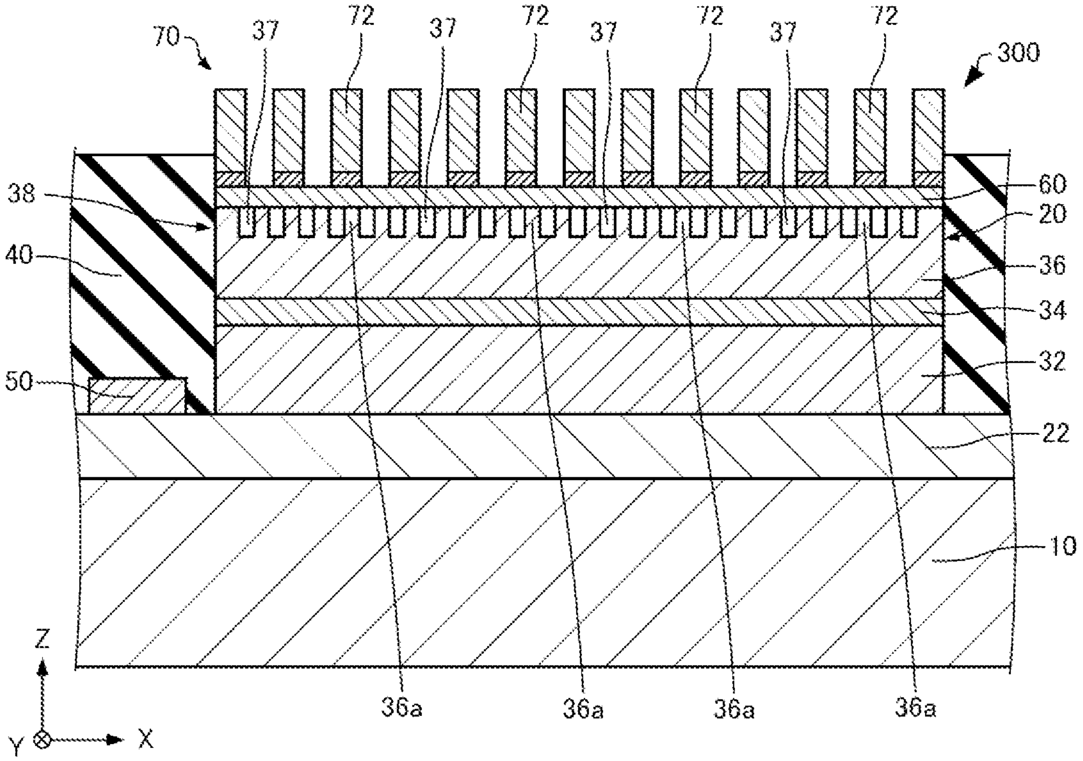
FIG. 7 is a cross-sectional view schematically illustrating a light-emitting device according to a third exemplary embodiment.

Next, with reference to the drawings, a light-emitting device 300 according to a third exemplary embodiment is described. FIG. 7 is a cross-sectional view schematically illustrating the light-emitting device 300 according to the third exemplary embodiment.

For the light-emitting device 300 according to the third exemplary embodiment, parts having similar functions to the constituent members in the light-emitting device 100 according to the first exemplary embodiment described above are denoted below with the same reference symbols, and detailed description therefor is omitted.

As illustrated in FIG. 7, the light-emitting device 300 is different from the light-emitting device 100 described above in that the laminated structure 20 includes a photonic crystal structure 38. In the illustrated example, the second semiconductor layer 36 includes the photonic crystal structure 38.

The second semiconductor layer 36 forms the photonic crystal structure 38. The photonic crystal structure 38 exerts a photonic crystal effect, confines the light generated at the light-emitting layer 34 in the in-plane direction, and emits the light in the lamination direction.

In the illustrated example, a plurality of holes 37 are provided in the second semiconductor layer 36. The hole 37 and a part 36*a* of the second semiconductor layer 36, which is positioned in the in-plane direction of the hole 37, form the photonic crystal structure 38. A photonic crystal effect is exerted due to a difference of refractive indexes of the part 36*a* of the second semiconductor layer 36 and the hole 37.

Although not illustrated, the hole 37 may be filled with a silicon oxide layer or the like. For example, the diameter of the hole 37 is from 50 nm to 500 nm.

Note that “the diameter of the hole” is a diameter of a circle when the planar shape of the hole 37 is circular, and is a diameter of a minimum inclusion circle when the planar shape of the hole 37 is not circular. For example, when the planar shape of the hole 37 is a polygon, the diameter of the hole 37 is a diameter of a minimum circle including the polygon therein. When the planar shape of the hole 37 is an oval, the diameter of the hole 37 is a diameter of a minimum circle including the oval therein. This holds true for "the diameter of the column portion" described below.

As viewed from the lamination direction, the plurality of holes 37 are arrayed at a predetermined pitch in a predetermined direction. For example, the plurality of holes 37 are arranged in a triangular grid shape. Note that the arrangement of the plurality of holes 37 is not particularly limited, and the arrangement may be made in a square grid shape.

Note that "the pitch of the hole" is a distance between the centers of the holes 37 adjacent to each other along the predetermined direction. "The center of the hole" is a center of a circle when the planar shape of the hole 37 is circular, and is a center of a minimum inclusion circle when the planar shape of the hole 37 is not circular. For example, when the planar shape of the hole 37 is a polygon, the center of the hole 37 is a center of a minimum circle including the polygon therein. When the planar shape of the hole 37 is an oval, the center of the hole 37 is a center of a minimum circle including the oval therein. This holds true for "the diameter of the column portion" described below.

In the light-emitting device 300, the light generated at the light-emitting layer 34 propagates the in-plane direction, forms a stationary wave due to a photonic crystal effect exerted by the plurality of holes 37, receives a gain at the light-emitting layer 34, and performs laser oscillation. Further, the light-emitting device 300 emits the +1 order diffraction light and the −1 order diffraction light as laser beams in the lamination direction. The light-emitting device 300 is a semiconductor laser that emits laser beams.

Of the light emitted from the photonic crystal structure 38 in the lamination direction, a ratio of the light having an electric field oscillating in the direction orthogonal to the extension direction of the wire portion 72 is greater than a ratio of the light having an electric field oscillating in the extension direction of the wire portion 72. The oscillation direction of the electric field of the light emitted from the photonic crystal structure 38 in the lamination direction can be controlled with the pitch, the shape, and the size of the hole 37.

For example, the light-emitting device 300 have the following features.

In the light-emitting device 300, the laminated structure 20 includes the photonic crystal structure 38 that confines the light generated at the light-emitting layer 34 in the in-plane direction of the substrate 10 and emits the light in the lamination direction. Thus, with the light-emitting device 300, a laser beam can be emitted in the lamination direction.

In the light-emitting device 300, of the light emitted from the photonic crystal structure 38 in the lamination direction, a ratio of the light having an electric field oscillating in the direction orthogonal to the extension direction of each of the plurality of wire portions 72 is greater than a ratio of the light having an electric field oscillating in the extension direction of each of the plurality of wire portions 72. The wire grid polarizing plate 70 transmits the light having an electric field oscillating in the direction orthogonal to the extension direction of the wire portion 72. Thus, as compared to a case in which a ratio of the light having an electric field oscillating in the direction orthogonal to the extension direction of the wire portion is less than a ratio of the light having an electric field oscillating in the extension direction of the wire portion, light utilization efficiency can be improved.

In the light-emitting device 300, the second semiconductor layer 36 forms the photonic crystal structure 38. For example, with the light-emitting device 300, the plurality of holes 37 are formed in the second semiconductor layer 36, and thus the photonic crystal structure 38 can be formed.

Note that, although not illustrated, the second semiconductor layer 36 may include a base portion provided at the upper side of the light-emitting layer 34 and a plurality of column portions protruding upward from the base portion, and the plurality of column portions may form the photonic crystal structure 38. For example, the plurality of column portions are formed in a similar manner to a plurality of column portions in a light-emitting device according to a fourth exemplary embodiment described later.

3.2. Method of Manufacturing Light-Emitting Device

Next, with reference to the drawings, a method of manufacturing the light-emitting device 300 according to the third exemplary embodiment is described.

The method of manufacturing the light-emitting device 300 is basically the same as the method of manufacturing the light-emitting device 100 described above, except that, as illustrated in FIG. 7, the plurality of holes 37 are formed in the second semiconductor layer 36 by electron beam lithography and dry etching, for example. Therefore, detailed description therefor is omitted.

4. Fourth Exemplary Embodiment 4.1. Light-Emitting Device

Figure 8:
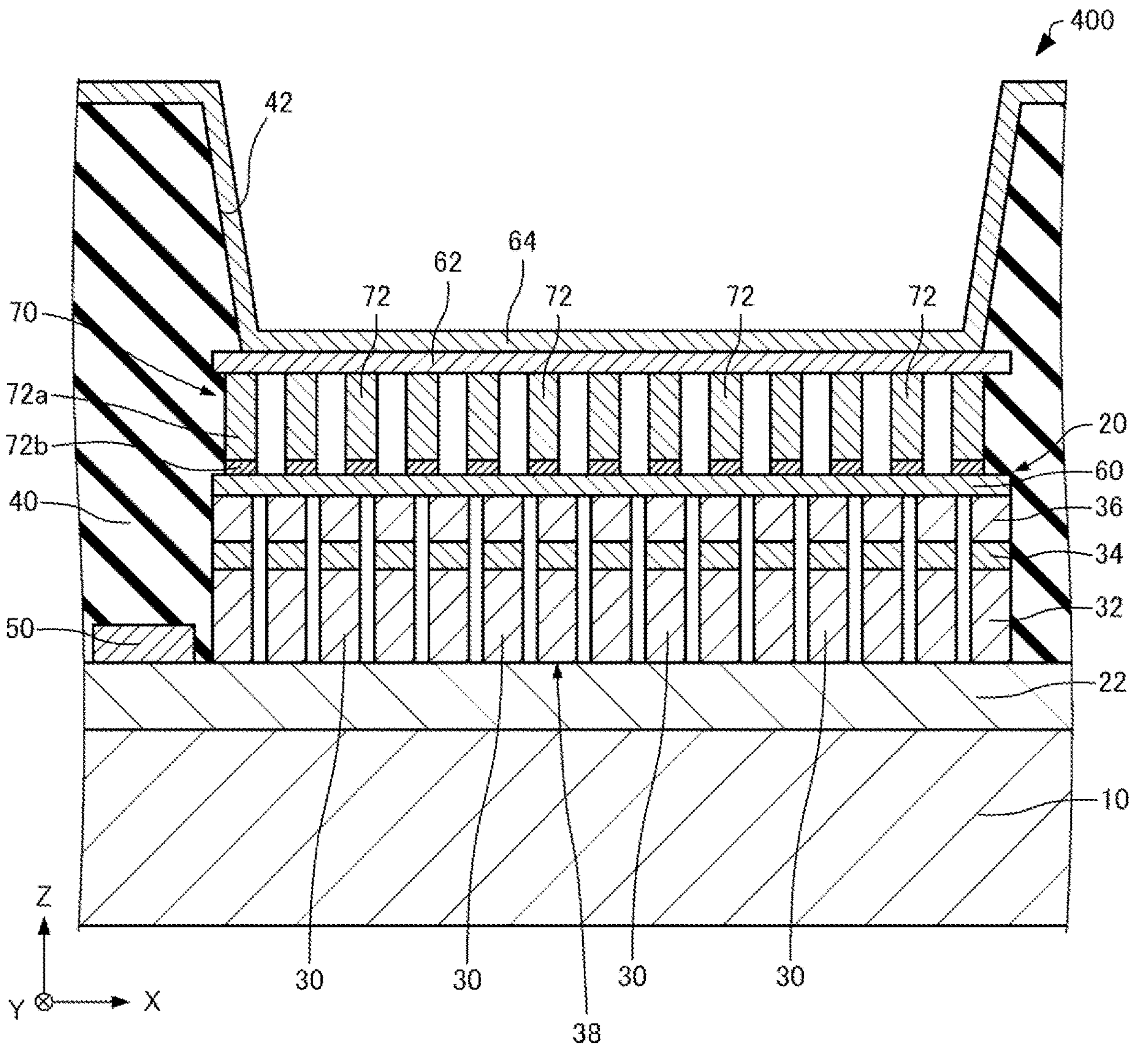
FIG. 8 is a cross-sectional view schematically illustrating a light-emitting device according to a fourth exemplary embodiment.

Next, with reference to the drawings, a light-emitting device 400 according to a fourth exemplary embodiment is described. FIG. 8 is a cross-sectional view schematically illustrating the light-emitting device 400 according to the fourth exemplary embodiment.

For the light-emitting device 400 according to the fourth exemplary embodiment, parts having similar functions to the constituent members in the light-emitting device 100 according to the first exemplary embodiment, the light-emitting device 200 according to the second exemplary embodiment, and the light-emitting device 300 according to the third exemplary embodiment described above are denoted below with the same reference symbols, and detailed description therefor is omitted.

As illustrated in FIG. 7, in the light-emitting device 300 described above, the second semiconductor layer 36 forms the photonic crystal structure 38.

In contrast, as illustrated in FIG. 8, in the light-emitting device 400, a plurality of column portions 30 form the photonic crystal structure 38.

The laminated structure 20 includes the plurality of column portions 30. The first semiconductor layer 32, the light-emitting layer 34, and the second semiconductor layer 36 form the plurality of column portions 30. On the upper side of the buffer layer 22, a mask layer, which is not illustrated, for forming the column portion 30 is provided. For example, the mask layer is a titanium layer, a titanium oxide layer, a silicon layer, or a silicon oxide layer.

The column portion 30 is provided at the upper side of the buffer layer 22. The column portion 30 has a columnar shape protruding upward from the buffer layer 22. In other words, the column portion 30 protrudes from the substrate 10 via the buffer layer 22. For example, the column portion 30 is also referred to as a nano column, a nano wire, a nano rod, and a nano pillar. For example, the planar shape of the column portion 30 is a polygon such as a regular hexagon or a circle.

For example, the diameter of the column portion 30 is from 50 nm to 500 nm. When the diameter of the column portion 30 is 500 nm or smaller, the light-emitting layer 34 with high quality crystal can be obtained, and distortion present inside the light-emitting layer 34 can be suppressed. With this, the light generated at the light-emitting layer 34 can be amplified with high efficiency.

A plurality of the column portions 30 are provided. For example, the interval between the adjacent column portions 30 is from 1 nm to 500 nm. As viewed from the lamination direction, the plurality of column portions 30 are arrayed at a predetermined pitch in a predetermined direction. For example, the plurality of column portions 30 are arranged in a triangular grid shape. Note that the arrangement of the plurality of column portions 30 is not particularly limited, and the arrangement may be made in a square grid shape.

The plurality of column portions 30 can exert a photonic crystal effect. The light generated at the light-emitting layer 34 propagates the in-plane direction, forms a stationary wave due to a photonic crystal effect exerted by the plurality of column portions 30, receives a gain at the light-emitting layer 34, and performs laser oscillation. Further, the light-emitting device 400 emits the +1 order diffraction light and the −1 order diffraction light as laser beams in the lamination direction. The light-emitting device 400 is a semiconductor laser that emits laser beams. The pitch of the plurality of column portions 30 may be larger or smaller than the pitch of the plurality of wire portions 72.

As viewed from the lamination direction, each of the plurality of column portions 30 overlaps with at least one of the plurality of wire portions 72. As viewed from the lamination direction, each of the plurality of column portions 30 may overlap with only one of the wire portions 72, or may overlap with two or more of the wire portions 72. As viewed from the lamination direction, of the plurality of column portions 30, there is no column portion 30 that does not overlap with the wire portion 72.

Similarly to the light-emitting device 200 described above, the light-emitting device 400 includes the second p-type electrode 62 and the third p-type electrode 64. Although not illustrated in FIG. 8, similarly to the light-emitting device 200 described above, the wiring line 80 couples the third p-type electrode 64 and the pad 90 to each other.

Note that, in the example described above, the gap is provided between the adjacent column portions 30, but a light propagation layer may be provided between the adjacent column portions 30. Through the light propagation layer, the light generated at the light-emitting layer 34 propagates. The light propagation layer may be a silicon oxide layer.

Further, the light-emitting device 400 may be an LED instead of a semiconductor laser.

For example, the light-emitting device 400 exerts the following actions and effects.

In the light-emitting device 400, the laminated structure 20 includes the plurality of column portions 30. The first semiconductor layer 32, the second semiconductor layer 36, and the light-emitting layer 34 form the plurality of column portions 30. The plurality of column portions 30 form the photonic crystal structure 38. Thus, with the light-emitting device 400, the light-emitting layer 34 with high quality crystal can be obtained, and distortion present inside the light-emitting layer 34 can be suppressed.

In the light-emitting device 400, as viewed from the lamination direction, each of the plurality of column portions 30 overlaps with at least one of the plurality of wire portions 72. Thus, as compared to a case in which there exists the column portion that does not overlap with the wire portion as viewed from the lamination direction, an electric current can be applied to the column portion 30 with higher uniformity in the light-emitting device 400.

4.2. Method of Manufacturing Light-Emitting Device

Next, with reference to the drawings, a method of manufacturing the light-emitting device 400 according to the fourth exemplary embodiment is described.

Similarly to the method of manufacturing the light-emitting device 100 described above, the buffer layer 22 is formed, and then the mask layer, which is not illustrated, is formed on the upper side of the buffer layer 22 in the method of manufacturing the light-emitting device 400. For example, the mask layer is formed through film formation by electron beam vapor deposition or s plasma CVD method and patterning. Patterning is performed by electron beam lithography and dry etching.

As illustrated in FIG. 8, with the mask layer as a mask, the first semiconductor layer 32, the light-emitting layer 34, and the second semiconductor layer 36 are subjected to epitaxial growth in the stated order on the upper side of the buffer layer 22. Examples of methods for epitaxial growth include an MOCVD method and an MBE method. Through this process, the plurality of column portions 30 are formed.

After that, in the method of manufacturing the light-emitting device 400, the first p-type electrode 60, the wire grid polarizing plate 70, the second p-type electrode 62, the n-type electrode 50, the insulating layer 40, and the third p-type electrode 64 are formed in a similar manner to the method of manufacturing the light-emitting device 200 described above.

Through the process described above, the light-emitting device 400 can be manufactured.

5. Fifth Exemplary Embodiment

Figure 9:
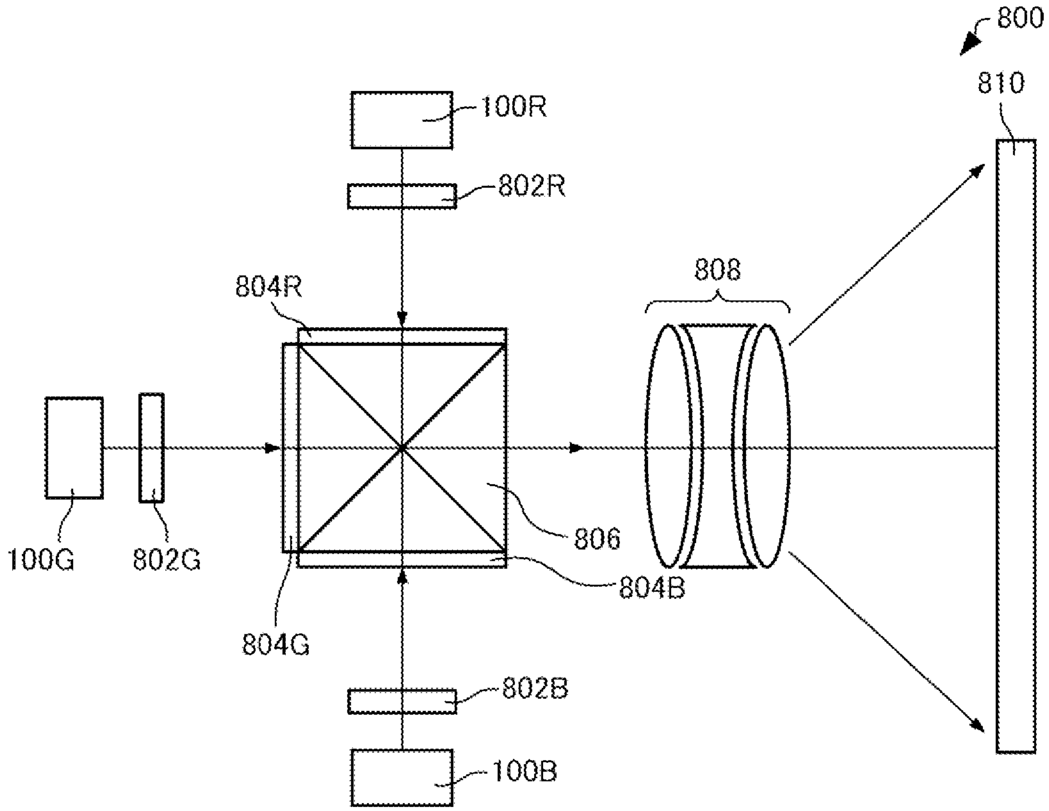
FIG. 9 is a cross-sectional view schematically illustrating a projector according to a fifth exemplary embodiment.

Next, with reference to the drawings, a projector according to a fifth exemplary embodiment is described. FIG. 9 is a view schematically illustrating a projector 800 according to the fifth exemplary embodiment.

For example, the projector 800 includes the light-emitting device 100 as a light source.

The projector 800 includes a housing, which is not illustrated, and a red light source 100R, a green light source 100G, and a blue light source 100B that are provided in the housing and emit light of a red color, light of a green color, and light of a blue color, respectively. Note that, for sake of convenience, in FIG. 9, the red light source 100R, the green light source 100G, and the blue light source 100B are simplified.

Moreover, the projector 800 includes, in the housing, a first optical element 802R, a second optical element 802G, a third optical element 802B, a first optical modulation device 804R, a second optical modulation device 804G, a third optical modulation device 804B, and a projection device 808. For example, each of the first optical modulation device 804R, the second optical modulation device 804G, and the third optical modulation device 804B is a transmissive-type liquid crystal light valve. For example, the projection device 808 is a projection lens.

Light emitted from the red light source 100R enters the first optical element 802R. The light emitted from the red light source 100R is condensed by the first optical element 802R. Note that the first optical element 802R may have a function other than condensing. The second optical element 802G and the third optical element 802B described later also function similarly.

The light condensed by the first optical element 802R enters the first optical modulation device 804R. The first optical modulation device 804R modulates the incident light, based on image information. Then, the projection device 808 enlarges an image formed by the first optical modulation device 804R, and projects the enlarged image onto a screen 810.

Light emitted from the green light source 100G enters the second optical element 802G. The light emitted from the green light source 100G is condensed by the second optical element 802G.

The light condensed by the second optical element 802G enters the second optical modulation device 804G. The second optical modulation device 804G modulates the incident light, based on image information. Then, the projection device 808 enlarges an image formed by the second optical modulation device 804G, and projects the enlarged image onto the screen 810.

Light emitted from the blue light source 100B enters the third optical element 802B. The light emitted from the blue light source 100B is condensed by the third optical element 802B.

The light condensed by the third optical element 802B enters the third optical modulation device 804B. The third optical modulation device 804B modulates the incident light, based on image information. Then, the projection device 808 enlarges an image formed by the third optical modulation device 804B, and projects the enlarged image onto the screen 810.

Further, the projector 800 may include a cross dichroic prism 806 that synthesizes the light emitted from the first optical modulation device 804R, the second optical modulation device 804G, and the third optical modulation device 804B and guides the synthesized light to the projection device 808.

The three types of color light modulated by the first optical modulation device 804R, the second optical modulation device 804G, and the third optical modulation device 804B enter the cross dichroic prism 806. The cross dichroic prism 806 is formed by bonding four rectangular prisms to one another, and a dielectric multilayer film that reflects light of a red color and a dielectric multilayer film that reflects light of a blue color are arranged on inner surfaces thereof. The three types of color light are synthesized by these dielectric multilayer films, and light representing a color image is generated. Then, the synthesized light is projected by the projection device 808 onto the screen 810, and the enlarged image is displayed.

Note that the red light source 100R, the green light source 100G, and the blue light source 100B may control the light-emitting device 100 according to image information as image pixels. With this, an image may be directly formed without using the first optical modulation device 804R, the second optical modulation device 804G, and the third optical modulation device 804B. Further, the projection device 808 enlarges the image formed by the red light source 100R, the green light source 100G, and the blue light source 100B, and may project the enlarged image onto the screen 810.

Further, in the example given above, the transmissive-type liquid crystal light valve is used as each of the optical modulation devices, but a light valve other than liquid crystal may be used, or a reflection-type light valve may be used. Examples of the light valve of this kind include a reflection-type liquid crystal light valve and a Digital Micro Mirror Device. Further, the configuration of the projection device is changed as appropriate according to a type of a light valve to be used.

Further, the light source is also applicable to a light source device of a scanning-type image display apparatus including a scanning means, the image display apparatus for displaying an image having a desired size on a display screen by performing scanning on the screen with light from the light source.

The exemplary embodiments and the modification examples described above are merely examples, and are not limited thereto. For example, each of the exemplary embodiments and each of the modification examples may be combined with each other as appropriate.

The present disclosure includes configurations that are substantially the same as the configurations described in the exemplary embodiments, for example, configurations with similar functions, methods, and results, or configurations with similar purposes and effects. Further, the present disclosure includes configurations obtained by replacing unessential parts of the configurations described in the exemplary embodiments. Further, the present disclosure includes configurations capable of exerting similar actions and effects or achieving similar purposes to those of the configurations described in the exemplary embodiments. Further, the present disclosure includes configurations obtained by adding a publicly-known technique to the configurations described in the exemplary embodiments.

The following contents are derived from the exemplary embodiments and the modification examples described above.

A light-emitting device according to one aspect includes a substrate, a laminated structure provided at the substrate, and a conductive layer provided at the laminated structure and configured to apply an electric current to the laminated structure, wherein the laminated structure is provided between the substrate and the conductive layer, and includes a first semiconductor layer of a first conductive type, a second semiconductor layer of a second conductive type different from the first conductive type, and a light-emitting layer provided between the first semiconductor layer and the second semiconductor layer, the conductive layer includes a plurality of wire portions extending in a direction orthogonal to a lamination direction of the laminated structure, and is configured to polarize light generated at the light-emitting layer, and an electric current is applied to the light-emitting layer via the plurality of wire portions.

With the light-emitting device, size reduction can be achieved.

The light-emitting device according to one aspect may further include a first electrode provided between the laminated structure and the conductive layer, wherein the conductive layer may be in contact with the first electrode, light generated at the light-emitting layer may pass through the first electrode, and be emitted, and an electric current may be applied to the light-emitting layer via the first electrode.

With the light-emitting device, an electric current can be applied to the light-emitting layer with high uniformity.

The light-emitting device according to one aspect may further include a second electrode provided at the conductive layer on a side opposite to the first electrode and coupled to the plurality of wire portions.

With the light-emitting device, the second electrode can protect the wire portions.

In the light-emitting device according to one aspect, the second electrode may be a transparent electrode that is transparent with respect to light generated at the light-emitting layer, and resistivity of each of the plurality of wire portions may be lower than resistivity of the second electrode.

With the light-emitting device, an electric current can be applied to the light-emitting layer with high uniformity.

In the light-emitting device according to one aspect, the laminated structure may include a photonic crystal structure configured to confine, in a direction orthogonal to the lamination direction, light generated at the light-emitting layer and emit the light in the lamination direction.

With the light-emitting device, for example, a laser beam can be emitted in the lamination direction.

In the light-emitting device according to one aspect, of light emitted from the photonic crystal structure in the lamination direction, a ratio of light having an electric field oscillating in a direction orthogonal to an extension direction of each of the plurality of wire portions may be greater than a ratio of light having an electric field oscillating in the extension direction of each of the plurality of wire portions.

With the light-emitting device, light utilization efficiency can be improved.

In the light-emitting device according to one aspect, the second semiconductor layer may form the photonic crystal structure.

With the light-emitting device, for example, a plurality of holes are formed in the second semiconductor layer, and thus the photonic crystal structure can be formed.

In the light-emitting device according to one aspect, the laminated structure may include a plurality of column portions, the first semiconductor layer, the second semiconductor layer, and the light-emitting layer may form the plurality of column portions, and the plurality of column portions may form the photonic crystal structure.

With the light-emitting device, the light-emitting layer of high quality crystal can be obtained, and distortion present inside the light-emitting layer can be suppressed.

In the light-emitting device according to one aspect, as viewed from the lamination direction, the plurality of column portions may overlap with at least one of the plurality of wire portions.

With the light-emitting device, an electric current can be applied to the column portions with high uniformity.

In the light-emitting device according to one aspect, the conductive layer may include a coupling portion configured to couple adjacent wire portions of the plurality of wire portions to each other.

With the light-emitting device, an electric current can be applied to the plurality of wire portions with high uniformity.

In the light-emitting device according to one aspect, each of the plurality of wire portions may include a first layer, and a second layer being provided between the first layer and the laminated structure and having a higher melting point than the first layer.

With the light-emitting device, the second layer can prevent atoms contained in the first layer from being dispersed in the first electrode.

A projector according to one aspect includes the light-emitting device according to the one aspect.

What is claimed is:

1. A light-emitting device, comprising:
- a substrate;
- a laminated structure provided at the substrate;
- a conductive layer provided at the laminated structure and configured to apply an electric current to the laminated structure;
- an insulating layer provided at the substrate and in contact with the conductive layer; and
- a first electrode provided between the laminated structure and the conductive layer, wherein
- the laminated structure is provided between the substrate and the conductive layer, and includes:
- a first semiconductor layer of a first conductive type;
- a second semiconductor layer of a second conductive type different from the first conductive type; and
- a light-emitting layer provided between the first semiconductor layer and the second semiconductor layer,
- the conductive layer includes a plurality of wire portions extending in a direction orthogonal to a lamination direction of the laminated structure, and is configured to polarize light generated at the light-emitting layer,
- an electric current is applied to the light-emitting layer via the plurality of wire portions,
- each of the plurality of wire portions is in contact with the first electrode, and
- as viewed from the lamination direction, the entire insulating layer is provided in a region other than a region where the conductive layer and the laminated structure are provided.

2. The light-emitting device according to claim 1, wherein
- the light generated at the light-emitting layer passes through the first electrode, and is emitted, and
- an electric current is applied to the light-emitting layer via the first electrode.

3. The light-emitting device according to claim 2, comprising
- a second electrode provided at the conductive layer on a side opposite to the first electrode and coupled to the plurality of wire portions.

4. The light-emitting device according to claim 3, wherein
- the second electrode is a transparent electrode that is transparent with respect to the light generated at the light-emitting layer, and
- a resistivity of each of the plurality of wire portions is lower than a resistivity of the second electrode.

5. The light-emitting device according to claim 1, wherein
- the laminated structure includes a photonic crystal structure configured to confine, in a direction orthogonal to the lamination direction, the light generated at the light-emitting layer and emit the light in the lamination direction.

6. The light-emitting device according to claim 5, wherein
- in the light emitted from the photonic crystal structure in the lamination direction, a ratio of light having an electric field oscillating in a direction orthogonal to an extension direction of each of the plurality of wire portions is greater than a ratio of light having an electric field oscillating in the extension direction of each of the plurality of wire portions.

7. The light-emitting device according to claim 5, wherein
- the second semiconductor layer forms the photonic crystal structure.

8. The light-emitting device according to claim 5, wherein
- the laminated structure includes a plurality of column portions,
- the first semiconductor layer, the second semiconductor layer, and the light-emitting layer form the plurality of column portions, and
- the plurality of column portions form the photonic crystal structure.

9. The light-emitting device according to claim 8, wherein
- as viewed from the lamination direction, the plurality of column portions overlap with at least one of the plurality of wire portions.

10. The light-emitting device according to claim 1, wherein
- the conductive layer includes a coupling portion configured to couple adjacent wire portions of the plurality of wire portions to each other.

11. The light-emitting device according to claim 1, wherein each of the plurality of wire portions includes:

a first layer; and a second layer provided between the first layer and the laminated structure, and having a higher melting point than the first layer.

12. A projector comprising the light-emitting device according to claim 1.

13. A light-emitting device, comprising:

a substrate;

a laminated structure provided at the substrate;

a conductive layer provided at the laminated structure and configured to apply an electric current to the laminated structure;

a first electrode provided between the laminated structure and the conductive layer; and a second electrode provided at the conductive layer on a side opposite to the first electrode, wherein the first electrode has a lower resistivity and a smaller thickness than the second electrode, the laminated structure is provided between the substrate and the conductive layer, and includes:

a first semiconductor layer of a first conductive type;

a second semiconductor layer of a second conductive type different from the first conductive type; and a light-emitting layer provided between the first semiconductor layer and the second semiconductor layer, the conductive layer includes a plurality of wire portions extending in a direction orthogonal to a lamination direction of the laminated structure, and is configured to polarize light generated at the light-emitting layer, an electric current is applied to the light-emitting layer via the plurality of wire portions, and the second electrode is coupled to and provided over each of the plurality of wire portions.

* * * * *